United States Patent
Kim et al.

(10) Patent No.: US 9,443,826 B2
(45) Date of Patent: Sep. 13, 2016

(54) STACK PACKAGE AND REDUCTION OF STANDBY CURRENT

(71) Applicant: SK hynix Inc., Icheon-si Gyeonggi-do (KR)

(72) Inventors: Tae Hyun Kim, Icheon-si (KR); Bo Kyeom Kim, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 112 days.

(21) Appl. No.: 14/460,885

(22) Filed: Aug. 15, 2014

(65) Prior Publication Data
US 2015/0348941 A1 Dec. 3, 2015

(30) Foreign Application Priority Data
Jun. 2, 2014 (KR) ........................ 10-2014-0067041

(51) Int. Cl.
*H03K 19/173* (2006.01)
*H01L 25/065* (2006.01)

(52) U.S. Cl.
CPC ... *H01L 25/0657* (2013.01); *H01L 2924/0002* (2013.01)

(58) Field of Classification Search
CPC .................................................. H01L 25/0657
See application file for complete search history.

(56) References Cited

U.S. PATENT DOCUMENTS

| 8,437,179 | B2 | 5/2013 | Osada et al. | |
|---|---|---|---|---|
| 2005/0152169 | A1* | 7/2005 | Goto | H01L 23/50 365/63 |
| 2010/0246152 | A1* | 9/2010 | Lin | G06F 1/16 361/783 |
| 2011/0292708 | A1* | 12/2011 | Kang | H01L 23/481 365/63 |
| 2011/0309475 | A1* | 12/2011 | Lee | G11C 5/025 257/532 |
| 2012/0138927 | A1* | 6/2012 | Kang | G01R 31/318513 257/48 |
| 2013/0001548 | A1* | 1/2013 | Jeong | H01L 22/34 257/48 |

FOREIGN PATENT DOCUMENTS

KR 1020100111006 A 10/2010

* cited by examiner

*Primary Examiner* — Jason M Crawford
(74) *Attorney, Agent, or Firm* — William Park & Associates Ltd.

(57) ABSTRACT

The stack package includes: a plurality of chips each stacked with a plurality of layers; and a plurality of pads respectively formed on the plurality of chips. Each chip includes: a ground path unit configured to form a current path between a pad and a ground stage; a selection unit configured to selectively control a connection path electrically coupled to the pad according to a chip enable signal; and a controller configured to selectively control a connection between the selection unit and the ground path unit according to a control signal.

18 Claims, 6 Drawing Sheets

STACK PACKAGE AND REDUCTION OF STANDBY CURRENT

CROSS-REFERENCE TO RELATED APPLICATION

This application claims priority based upon Korean patent application No. 10-2014-0067041, filed on Jun. 2, 2014, the disclosure of which is hereby incorporated in its entirety by reference herein.

BACKGROUND

In recent times, the demand of super-miniaturized and high-capacity semiconductor memories is rapidly increasing in response to a miniaturization and a higher-performance of electronic appliances and the increasing demand of mobile products. Generally, a variety of methods for increasing storage capacity of semiconductor memories have been widely used. First, one method for increasing storage capacity of semiconductor memories is to increase the integration degree of semiconductor chips. Second, another method for increasing storage capacity of semiconductor memories is to populate and assemble a plurality of semiconductor chips into a single semiconductor package.

The method of increasing storage capacity of semiconductor memories requires much more efforts and costs and much longer time. However, the method of increasing the integration degree of semiconductor chips is able to easily increase storage capacity of semiconductor memories by changing only the packaging method.

In addition, the method of increasing the integration degree of semiconductor chips is more advantageous than the method of increasing storage capacity of semiconductor memories in terms of costs, efforts, and time consumed in development and research environments. As a result, manufacturers of semiconductor memories have made efforts to increase storage capacity of semiconductor memory devices through multi-chip packaging in which multiple semiconductor chips are populated on a single semiconductor package.

SUMMARY

In accordance with an embodiment of the invention, a stack package includes: a plurality of chips each stacked with a plurality of layers; and a plurality of pads respectively formed on the plurality of chips. Each of the chips includes: a ground path unit configured to form a current path between a pad and a ground stage. Each chip also includes a selection unit configured to selectively control a connection path electrically coupled to the pad according to a chip enable signal. In addition, each chip includes a controller configured to selectively control a connection between the selection unit and the ground path unit according to a control signal.

In accordance with an embodiment of the invention, a stack package includes: a pad formed on a first chip. The first chip includes a ground path unit configured to form a current path between the pad and the ground stage. The first chip also includes a selection unit configured to selectively control a connection path electrically coupled to the pad according to a chip enable signal. Further, the first chip includes a controller configured to selectively control a connection between the selection unit and the ground path unit according to a control signal.

DETAILED DESCRIPTION

Reference will now be made in detail to the embodiments of the invention, examples of which are illustrated in the accompanying drawings. Wherever possible, the same reference numbers will be used throughout the drawings to refer to the same or like parts. Embodiments of the invention relate to a stack package, and more particularly to a technology capable of reducing a standby current by blocking a current path during a standby mode of a multi-stacked chip. An embodiment of the invention relates to a technology capable of reducing a standby current by blocking a current path during a standby mode of a multi-stacked chip. A stack package according to embodiments will hereinafter be described with reference to various drawings.

Figure 1:
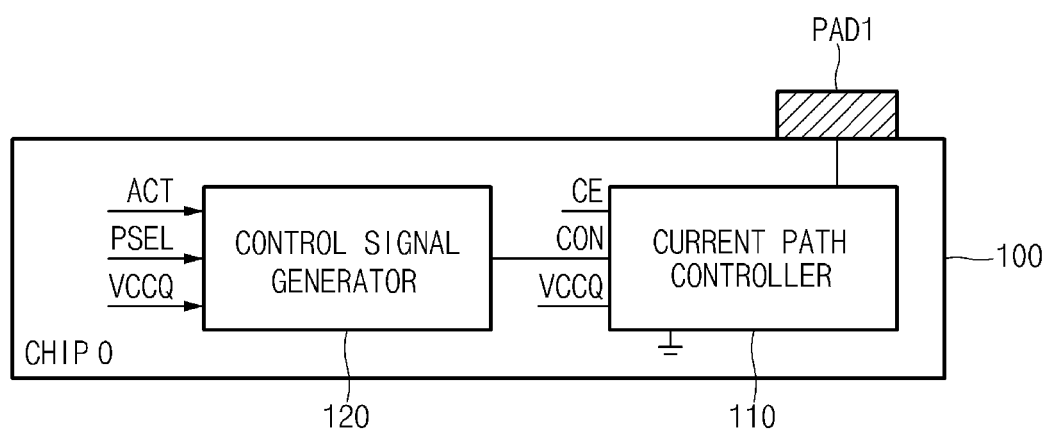
FIG. 1 is a block diagram illustrating a stack package according to an embodiment of the invention.

Referring to FIG. 1, a block diagram illustrating a stack package according to an embodiment of the invention is shown.

The stack package according to an embodiment includes a pad PAD1 on a chip 100. The chip 100 includes not only a current path controller 110 to control a current path of the pad PAD1 during a standby mode, but also a control signal generator 120.

The current path controller 110 is electrically coupled to the pad PAD1. The current path controller 110 may selectively control a current path between the pad PAD1 and a ground stage according to a chip enable signal CE, a control signal CON, and a power-supply voltage VCCQ.

More specifically, the current path controller 110 selects the corresponding chip 100 when the chip enable signal CE is at a low level, so that the pad PAD1 can be used. Therefore, a current path between the pad PAD1 and the ground stage is formed on the condition that the control signal CON is activated to a high level.

In contrast, if the chip enable signal CE is at a high level, the current path controller 110 does not select the corresponding chip 100 so that the pad PAD1 is not used. Consequently, the current path controller 110 blocks a current path between the pad PAD1 and the ground stage under the condition that the control signal CON is disabled (or deactivated) to a low level.

The control signal generator 120 generates the control signal CON to control a current path according to an active signal ACT, a pad selection signal PSEL, and a power-supply voltage VCCQ, and outputs the control signal CON to the current path controller 110. That is, if the pad selection signal PSEL is enabled to a high level under the condition that the active signal ACT is at a high level, the control signal generator 120 then outputs the control signal CON of a low level. If the control signal CON is at a low level, the control signal generator 120 decides a standby mode, so that the control signal generator 120 blocks a current path of the current path controller 110.

Figure 2:
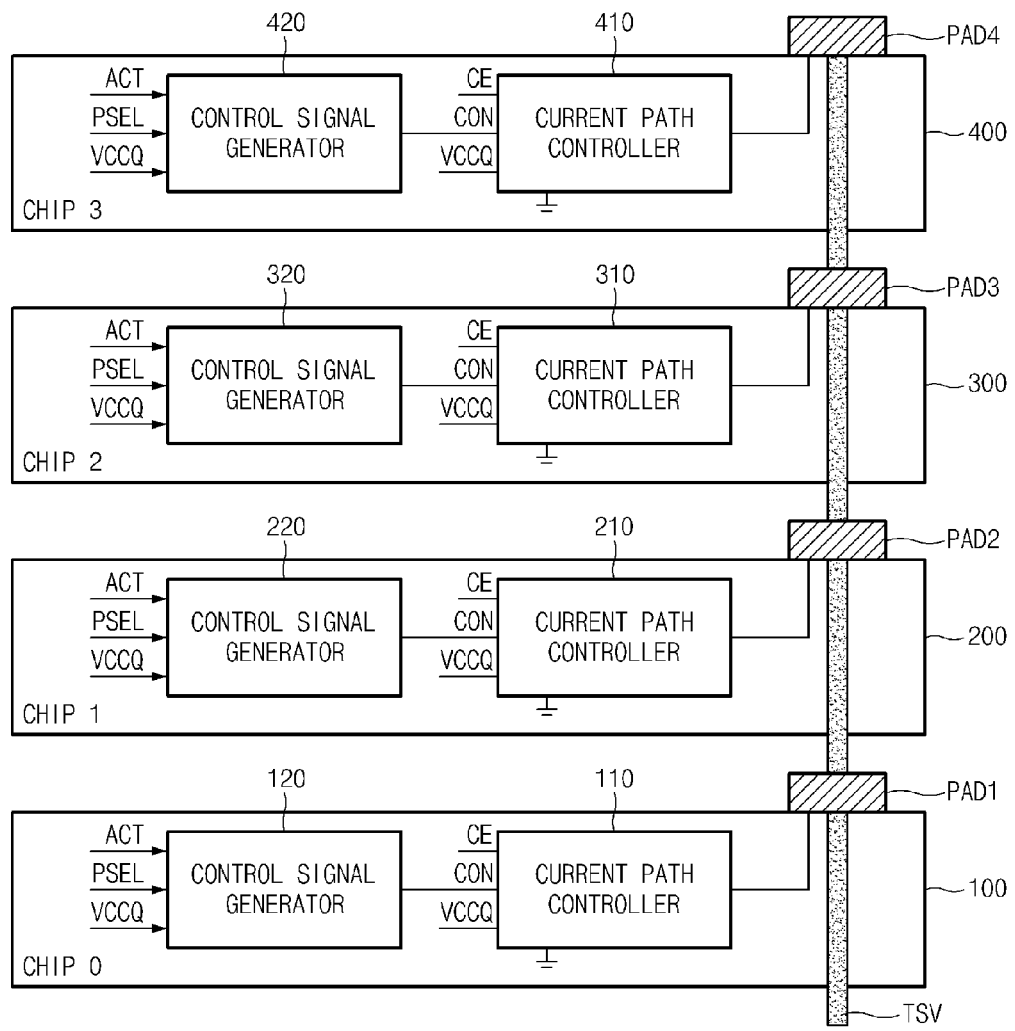
FIG. 2 is a block diagram illustrating a stack package according to an embodiment of the invention.

Referring to FIG. 2, a block diagram illustrating a stack package according to an embodiment of the invention is illustrated.

The stack package may include a plurality of chips (100, 200, 300, 400). For example, each of the semiconductor chips (100, 200, 300, 400) may be stacked with four layers.

Pads (PAD1, PAD2, PAD3, PAD4) may be formed on the chips (100, 200, 300, 400), respectively. If semiconductor chips are vertically stacked, it is necessary for individual chips (100, 200, 300, 400) arranged in a vertical direction to be electrically interconnected. The pads (PAD1~PAD4) respectively stacked on the chips (100, 200, 300, 400) may then be interconnected through a through silicon via (TSV).

The chips (100, 200, 300, 400) may include current path controllers (110, 210, 310, 410) and control signal generators (120, 220, 320, 420), respectively. If any one (e.g., chip 100) of the chips (100, 200, 300, 400) is selected, the corresponding pad (e.g., PAD1) is used. Further, a ground path of the remaining unused pads is cut off to prevent the occurrence of a leakage current.

To prevent a leakage current from flowing in the remaining unused pads (PAD2~PAD4), a plurality of current path controllers (110, 210, 310, 410) and a plurality of control signal generators (120, 220, 320, 420) are formed in the chips (100, 200, 300, 400), respectively. The current path controllers (110, 210, 310, 410) and the control signal generators (120, 220, 320, 420) respectively formed in the chips (100, 200, 300, 400) are identical to those of FIG. 4.

Figure 3:
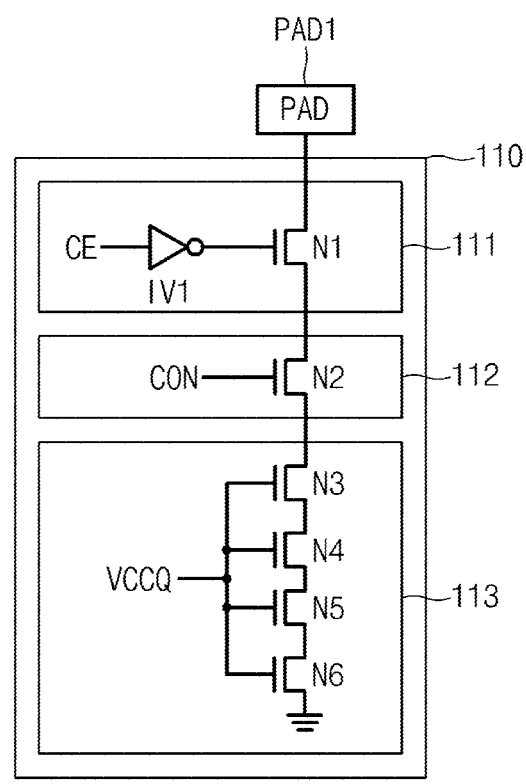
FIG. 3 is a detailed circuit diagram illustrating current path controllers shown in FIGS. 1 and 2.
Figure 4:
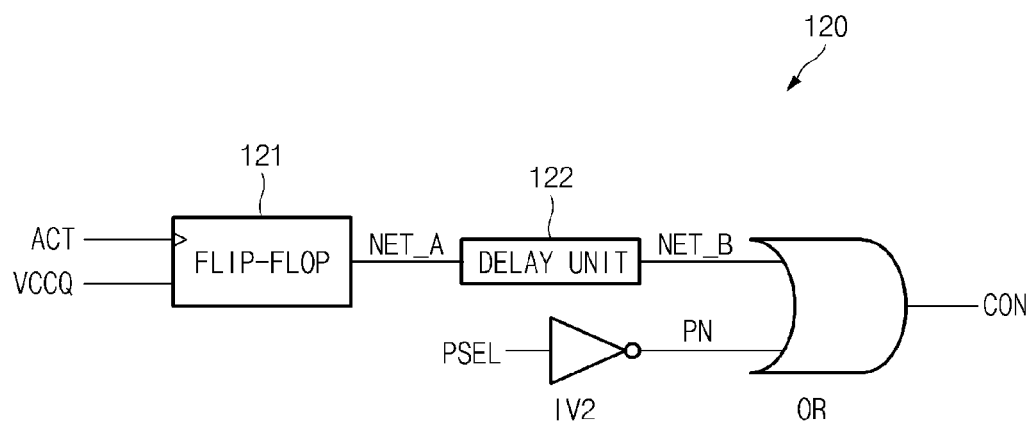
FIG. 4 is a detailed circuit diagram illustrating control signal generators shown in FIGS. 1 and 2.
Figure 5:
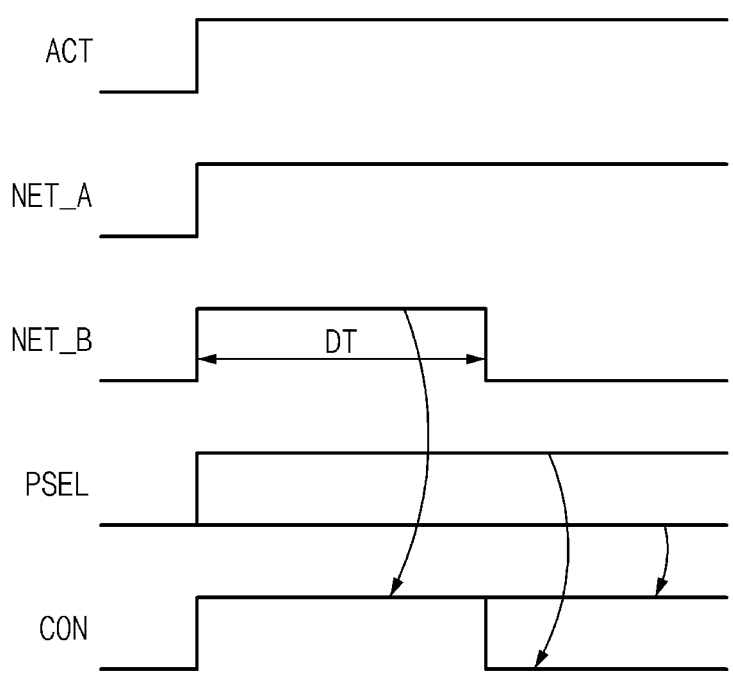
FIG. 5 is a timing diagram illustrating signals of the control signal generator shown in FIG. 4.

Referring to FIG. 3, a detailed circuit diagram illustrating the current path controllers (110, 210, 310, 410) shown in FIGS. 4 and 5 is shown.

Detailed structures of the current path controllers (110, 210, 310, 410) are identical to one another, so that a detailed structure of the single current path controller 110 will hereinafter be described as an example. The current path controller 110 includes a selection unit 111, a controller 112, and a ground path unit 113.

In this instance, the selection unit 111 may be selectively electrically coupled to the pad PAD1, the controller 112, or the ground path unit 113 according to the chip enable signal CE.

The selection unit 111 may include an inverter IV1 and an NMOS transistor N1 acting as a switching element. The inverter IV1 may invert the chip enable signal CE. The NMOS transistor N1 is electrically coupled between the pad PAD1 and the controller 112, so that the NMOS transistor N1 may receive an output signal of the inverter IV1 through a gate terminal.

More specifically, if one chip 100 from among plural chips (100, 200, 300, 400) is selected, the chip enable signal CE is activated to a low level. If the chip enable signal CE is activated to a low level, an output signal of the inverter IV1 is at a high level so that an NMOS transistor N1 is turned on. A connection path between the pad PAD1 and the controller 112 is formed so that an output signal of the pad PAD1 is applied to the controller 112.

On the other hand, during a standby mode in which one chip 100 from among plural chips (100, 200, 300, 400) is not selected, the chip enable signal CE is deactivated to a high level. If the chip enable signal CE is deactivated to a high level, an output signal of the inverter IV1 is at a low level so that the NMOS transistor N1 is turned off. As a result, a connection path between the pad PAD1 and the controller 112 is cut off so that an output signal of the pad PAD1 is not applied to the controller 112.

The controller 112 may selectively control a current path between the selection unit 111 and the ground path unit 113 in response to a state of the control signal CON. A state of the control signal CON may be changed according to whether data (or signal) is applied to the pad PAD1.

The controller 112 may include an NMOS transistor N2 acting as a switching element. The NMOS transistor N2 is electrically coupled between the selection unit 111 and the ground path unit 113, so that the NMOS transistor N2 receives the control signal CON through a gate terminal.

More specifically, if the pad PAD1 is selected when the chip 100 is activated and data is applied to the current path controller through the pad PAD1, the control signal CON is activated to a high level. If the control signal CON is activated, the NMOS transistor N2 of the controller 112 is then turned on. The controller 112 may transmit data received from the pad PAD1 to the ground path unit 113 through the selection unit 111.

In contrast, if the pad PAD1 is not selected under the condition that the chip 100 is in the standby mode so that data is not applied to the current path controller through the pad PAD1, the control signal CON is then deactivated to a low level. If the control signal CON is deactivated, the NMOS transistor N2 of the controller 112 is turned off. A connection path of the selection unit 111 is cut off so that the controller 112 does not transmit data received from the pad PAD1 to the ground path unit 113.

In addition, the ground path unit 113 may form a current path between the pad PAD1 and the ground stage. The ground path unit 113 may include a plurality of NMOS transistors N3~N6, each of which is used as a switching element.

The NMOS transistors N3~N6 are electrically coupled in series between the controller 112 and the ground stage. Further, the power-supply voltage VCCQ is applied to the NMOS transistors N3~N6, so that the NMOS transistors N3~N6 may remain turned on. The ground path unit 113 may form a current path of data received from the pad PAD1 through the selection unit 111 and the controller 112.

Referring to FIG. 4, a detailed circuit diagram illustrating the control signal generators (120, 220, 320, 420) shown in FIGS. 4 and 5 is shown.

Detailed structures of the control signal controllers (120, 220, 320, 420) are identical to one another, so that a detailed structure of the single control signal controller 120 will hereinafter be described as an example. The control signal controller 120 includes a flip-flop 121, a delay unit 122, an inverter IV2, and a logical OR gate (OR).

The flip-flop 121 may flip-flop an active signal ACT in response to the power-supply voltage VCCQ to output a control signal NET_A. The delay unit 122 may output a control signal NET_B by delaying the control signal NET_A. In this case, the delay unit 122 includes an up-delay element that delays a high-enable signal of the control signal NET_A by a predetermined time in such a manner that the high-enable signal transitions to a low level after lapse of the predetermined time.

The inverter IV2 may invert a pad selection signal PSEL and output a selection signal PD. In addition, the OR gate (OR) may perform a logic OR operation between the control signal NET_B and the selection signal PD, thereby generating a control signal CON.

Referring to FIG. 5, a timing diagram illustrating signals of the control signal generator 120 shown in FIG. 4 is shown. The operations of the control signal generator 120 will hereinafter be described with reference to FIG. 5.

Referring to FIG. 5, if the active signal ACT is enabled to a high level, the flip-flop 121 may flip-flop the active signal ACT in response to the power-supply voltage VCCQ, so that the flip-flop 121 may output the control signal NET_A of a high level.

The delay unit 122 is synchronized with a high enable signal of the control signal NET_A so that the control signal NET_B is enabled to a high level. In this instance, the delay unit 122 may delay the control signal NET_B by a predetermined time corresponding to a specific period of DT. After lapse of the DT period, the delay unit 122 may control the control signal NET_B to be transitioned to a low level so that the delay unit 122 outputs the low-level control signal NET_B.

The pad selection signal PSEL indicating whether the pad PAD1 is selected is at a high level or a low level, so that the resultant high- or low-level pad selection signal PSEL is input to the inverter IV2. In this instance, if the pad PAD1 is selected, the pad selection signal PSEL of a high level is then input to the inverter IV2. If the pad PAD1 is selected, the pad selection signal PSEL of a low level is input to the inverter IV2.

In this case, since the control signal NET_B still remains high in level during the DT period, the control signal CON remains high in level irrespective of the pad selection signal PSEL. A specific period to determine either a floating state in which a wire is not electrically coupled to the pad PAD1 or a ground state in which a low-level data is input to the pad PAD1 is needed. Accordingly, irrespective of whether a low-level signal or a high-level signal is input to the pad PAD1 during the DT period, the control signal CON of a high level is output for a predetermined time.

Thereafter, the control signal NET_B may transition to a low level after lapse of the DT period. Accordingly, if the pad selection signal PSEL is at a high level, the control signal CON of a low level is output. If the pad selection signal PSEL is at a low level, the control signal CON of high level is then output.

Logic levels of respective nodes related to the control signal generator 120 are shown in the following Table 1.

TABLE 1

| NET_B | PSEL | PN | CON |
|-------|------|----|----|
| 0 | 0 | 1 | 1 |
| 0 | 1 | 0 | 0 |
| 1 | 0 | 1 | 1 |
| 1 | 1 | 0 | 1 |

As shown in Table 1, if the control signal NET_B is at a logic-1 (high) level, it can be recognized that the control signal CON is at a logic-1 level irrespective of the pad selection signal PSEL. If the control signal NET_B is at a logic-0 (low) level, it can then be recognized that the control signal CON is output in the same manner as in the selection signal PN.

Figure 6:
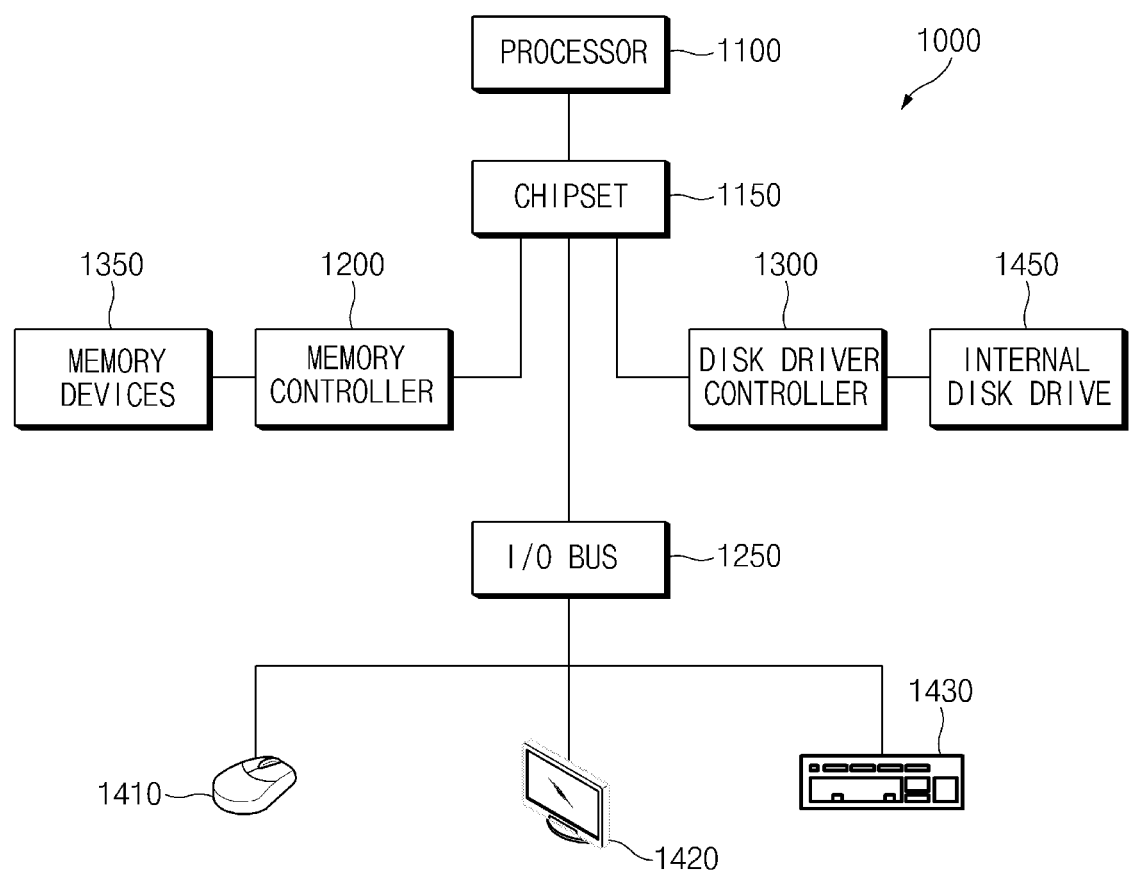
FIG. 6 illustrates a block diagram of a system employing a memory controller circuit in accordance with an embodiment of the invention.

Referring to FIG. 6, a system 1000 may include one or more processors 1100. The processor 1100 may be used individually or in combination with other processors. A chipset 1150 may be operably electrically coupled to the processor 1100. The chipset 1150 is a communication pathway for signals between the processor 1100 and other components of the system 1000. Other components may include a memory controller 1200, an input/output ("I/O") bus 1250, and a disk drive controller 1300. Depending on the configuration of the system 1000, any one of a number of different signals may be transmitted through the chipset 1150.

The memory controller 1200 may be operably electrically coupled to the chipset 1150. The memory controller 1200 can receive a request provided from the processor 1100 through the chipset 1150. The memory controller 1200 may be operably electrically coupled to one or more memory devices 1350. The stack package described above may be configured within the one or more memory devices 1350.

The chipset 1150 may also be electrically coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420 and 1430.

The disk drive controller 1300 may also be electrically coupled to the chipset 1150. The disk drive controller 1300 may serve as the communication pathway between the chipset 1150 and one or more internal disk drives 1450. The disk drive controller 1300 and the internal disk drives 1450 may communicate with each other or with the chipset 1150 using virtually any type of communication protocol.

As is apparent from the above description, the stack package according to various embodiments can reduce an unnecessary standby current during a standby mode by blocking a current path of a pad used in a multi-stacked chip.

Those skilled in the art will appreciate that the invention may be carried out in other specific ways than those set forth herein without departing from the spirit and essential characteristics of the invention. The above embodiments are therefore to be construed in all aspects as illustrative and not restrictive. The scope of the invention should be determined by the appended claims and their legal equivalents, not by the above description. Further, all changes coming within the meaning and equivalency range of the appended claims are intended to be embraced therein. In addition, it is obvious to those skilled in the art that claims that are not explicitly cited in each other in the appended claims may be presented in combination as an embodiment of the invention or included as a new claim by a subsequent amendment after the application is filed.

Although a number of illustrative embodiments consistent with the invention have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A stack package comprising:
  a plurality of chips each stacked with a plurality of layers; and
  a plurality of pads respectively formed on the plurality of chips,
  wherein each of the chips includes:
    a ground path unit configured to form a current path between a pad and a ground stage;
    a selection unit configured to selectively control a connection path electrically coupled to the pad according to a chip enable signal; and a controller configured to selectively control a connection between the selection unit and the ground path unit according to a control signal, wherein the selection unit connects the pad to the controller when the chip enable signal is activated, and severs a connection between the pad and the controller during a standby mode in which the chip enable signal is deactivated.

2. The stack package according to claim 1, wherein the selection unit includes:
a first inverter configured to invert the chip enable signal; and
a first switching element electrically coupled between the pad and the controller and is switched by an output signal of the first inverter.

3. The stack package according to claim 1, wherein the controller connects the selection unit to the ground path unit when the control signal is activated, and severs a connection between the selection unit and the ground path unit during a standby mode in which the control signal is deactivated.

4. The stack package according to claim 1, wherein the controller includes a second switching element electrically coupled between the selection unit and the ground path unit and is then switched by the control signal.

5. The stack package according to claim 1, wherein the ground path unit includes a plurality of switching elements electrically coupled in series between the controller and the ground stage so as to receive a power-supply voltage through a common gate terminal.

6. The stack package according to claim 1, further comprising:
a control signal generator configured to generate the control signal in response to an active signal and a pad selection signal.

7. The stack package according to claim 6, wherein the control signal generator includes:
a flip-flop configured to output a first control signal by flip-flopping the active signal;
a delay unit configured to output a second control signal by delaying the first control signal by a predetermined time; and
a logic element configured to perform a logic operation between an output result of the second control signal and an inversion signal of the pad selection signal.

8. The stack package according to claim 7, wherein the delay unit includes an up-delay element configured to delay a high-enable time of the first control signal by the predetermined time.

9. The stack package according to claim 7, wherein the control signal generator enables the control signal to be at a high level when the second control signal is at a high level, and outputs the control signal according to the pad selection signal when the second control signal is at a low level.

10. The stack package according to claim 1, wherein:
if an active signal is activated, the controller is coupled to the ground path unit according to the control signal during a predetermined time irrespective of a pad selection signal, and controls a path coupled to the ground path unit in response to the pad selection signal after lapse of the predetermined time.

11. A stack package comprising:
a pad formed on a first chip,
wherein the first chip includes:
a ground path unit configured to form a current path between the pad and the ground stage;
a selection unit configured to selectively control a connection path electrically coupled to the pad according to a chip enable signal; and
a controller configured to selectively control a connection between the selection unit and the ground path unit according to a control signal,
wherein the selection unit connects the pad to the controller when the chip enable signal is activated, and severs a connection between the pad and the controller when the chip enable signal is deactivated.

12. The stack package according to claim 11, wherein the selection unit includes:
a first inverter configured to invert the chip enable signal; and
a first switching element electrically coupled between the pad and the controller and is switched by an output signal of the first inverter.

13. The stack package according to claim 11, wherein the controller connects the selection unit to the ground path unit when the control signal is activated, and severs a connection between the selection unit and the ground path unit when the control signal is deactivated.

14. The stack package according to claim 11, wherein the controller includes a second switching element electrically coupled between the selection unit and the ground path unit and is then switched by the control signal.

15. The stack package according to claim 11, wherein:
if an active signal is activated, the controller is coupled to the ground path unit according to the control signal during a predetermined time irrespective of a pad selection signal, and controls a path coupled to the ground path unit in response to the pad selection signal after lapse of the predetermined time.

16. The stack package according to claim 11, further comprising:
a control signal generator configured to generate the control signal in response to an active signal and a pad selection signal.

17. The stack package according to claim 16, wherein the control signal generator includes:
a flip-flop configured to output a first control signal by flip-flopping the active signal;
a delay unit configured to output a second control signal by delaying the first control signal by a predetermined time; and
a logic element configured to perform a logic operation between an output result of the second control signal and an inversion signal of the pad selection signal.

18. The stack package according to claim 17, wherein the delay unit includes an up-delay element configured to delay a high-enable time of the first control signal by the predetermined time.

* * * * *